US012721222B2

(12) United States Patent
Zeng et al.

(10) Patent No.: US 12,721,222 B2
(45) Date of Patent: Aug. 25, 2026

(54) SEMICONDUCTOR PACKAGE STRUCTURE, FABRICATION METHOD AND MEMORY SYSTEM

(71) Applicant: YANGTZE MEMORY TECHNOLOGIES CO., LTD., Wuhan (CN)

(72) Inventors: Xinru Zeng, Wuhan (CN); Peng Chen, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 404 days.

(21) Appl. No.: 18/220,768

(22) Filed: Jul. 11, 2023

(65) Prior Publication Data

US 2024/0332269 A1 Oct. 3, 2024

(30) Foreign Application Priority Data

Apr. 3, 2023 (CN) ......................... 202310347954.9

(51) Int. Cl.

| | |
|---|---|
| ***H10W 90/00*** | (2026.01) |
| ***H10B 80/00*** | (2023.01) |
| ***H10W 40/10*** | (2026.01) |
| *H10W 90/24* | (2026.01) |

(52) U.S. Cl.
CPC ............ *H10W 90/00* (2026.01); *H10B 80/00* (2023.02); *H10W 40/10* (2026.01); *H10W 90/701* (2026.01); *H10W 90/24* (2026.01); *H10W 90/722* (2026.01); *H10W 90/732* (2026.01)

(58) Field of Classification Search
CPC ........................... H01L 25/105; H10W 90/297
See application file for complete search history.

(56) References Cited

U.S. PATENT DOCUMENTS

2021/0210397 A1* 7/2021 Kang ................. H01L 23/5385

* cited by examiner

*Primary Examiner* — Yu-Hsi D Sun
(74) *Attorney, Agent, or Firm* — BAYES PLLC

(57) ABSTRACT

The present disclosure provides a semiconductor package structure, a fabrication method, and a memory system. The semiconductor package structure includes a plurality of package bodies stacked in a first direction. At least one of the plurality of package bodies includes first interconnect structures extending in the first direction and a plurality of sub package bodies stacked in the first direction. Each of the plurality of sub package bodies includes a molding body and a device structure encapsulated in the molding body. The device structure includes a passive device. The passive device includes at least one of a resistor, a capacitor, and an inductor.

20 Claims, 14 Drawing Sheets

1000

2000 stacking a plurality of sub package bodies in a first direction, wherein each of the plurality of sub package bodies includes a molding body and a device structure encapsulated in the molding body, the device structure includes at least one of a passive device and an active device with the passive device including at least one of a resistor, a capacitor and an inductor and the active device including at least one of an electronic tube, a transistor, a nonvolatile memory chip and a random access memory chip, wherein the nonvolatile memory chip includes at least one of a 3D NAND memory chip, a 3D NOR memory chip, a ferroelectric memory chip, and a phase change memory chip

S1 disposing first interconnect structures extending in the first direction in the plurality of stacked sub package bodies to form a package body

S2 stacking a plurality of package bodies in the first direction to form the package structure

SEMICONDUCTOR PACKAGE STRUCTURE, FABRICATION METHOD AND MEMORY SYSTEM

CROSS-REFERENCE TO RELATED APPLICATION

The present application claims the benefit of priority to Chinese Patent Application No. 202310347954.9, filed on Apr. 3, 2023, which is hereby incorporated by reference in its entirety.

TECHNICAL FIELD

The present disclosure relates to the field of semiconductor technologies, and in particular to a semiconductor package structure, a method of fabricating a semiconductor package structure and a memory system.

BACKGROUND

Chip packages play an important role in miniaturization of modern semiconductor devices. A plurality of integrated circuits are packaged into a single package to achieve integration of homogeneous and heterogeneous chips. For example, a memory chip and a control logic unit may be integrated into a single package to reduce device footprint and improve device performance while achieving lower fabrication cost.

SUMMARY

The present disclosure provides a semiconductor package structure, a method of fabricating a semiconductor package structure, and a memory system.

One aspect of the present disclosure provides a semiconductor package structure including a plurality of package bodies stacked in a first direction. At least one of the plurality of package bodies includes first interconnect structures extending in the first direction and a plurality of sub package bodies stacked in the first direction, each of the plurality of sub package bodies includes a molding body and a device structure encapsulated in the molding body. The device structure includes at least one of a passive device or an active device with the passive device. The passive device includes at least one of a resistor, a capacitor, or an inductor. The active device includes at least one of an electronic tube, a transistor, or a memory chip.

Another aspect of the present disclosure provides a method of fabricating a semiconductor package structure, including: stacking a plurality of sub package bodies in a first direction, where each of the plurality of sub package bodies includes a molding body and a device structure encapsulated in the molding body; disposing first interconnect structures extending in the first direction in the plurality of stacked sub package bodies to form a package body; and stacking a plurality of package bodies in the first direction to form the package structure, where the device structure includes at least one of a passive device or an active device with the passive device. The passive device includes at least one of a resistor, a capacitor, or an inductor. The active device includes at least one of an electronic tube, a transistor, or a memory chip.

Yet another aspect of the present disclosure provides a memory system including a controller and a memory, where the controller is coupled to the memory to control data storage of the memory, and at least one of the controller or the memory is in the package structure according to any aspect of the present disclosure.

In accordance with at least one implementation of the present disclosure, a plurality of device structures of different types can be encapsulated in the sub package bodies and a plurality of package bodies in a high stack may be electrically interconnected through interconnect structures such as the first interconnect structures extending in the direction in which the sub package bodies are stacked, thus increasing the density of the overall circuit layout and compatibility of the package structure, reducing the complexity of the packaging process, and satisfying the need for light small low-profile electronic products.

BRIEF DESCRIPTION OF DRAWINGS

Through reading the detailed description of the non-limiting implementations made with reference to the following figures, other characteristics, purposes, and advantages of the present disclosure will become more apparent.

FIG. 10 is a flow chart of a method of fabricating a semiconductor package structure in accordance with some implementations of the present disclosure;

DETAILED DESCRIPTION

Figure 1:
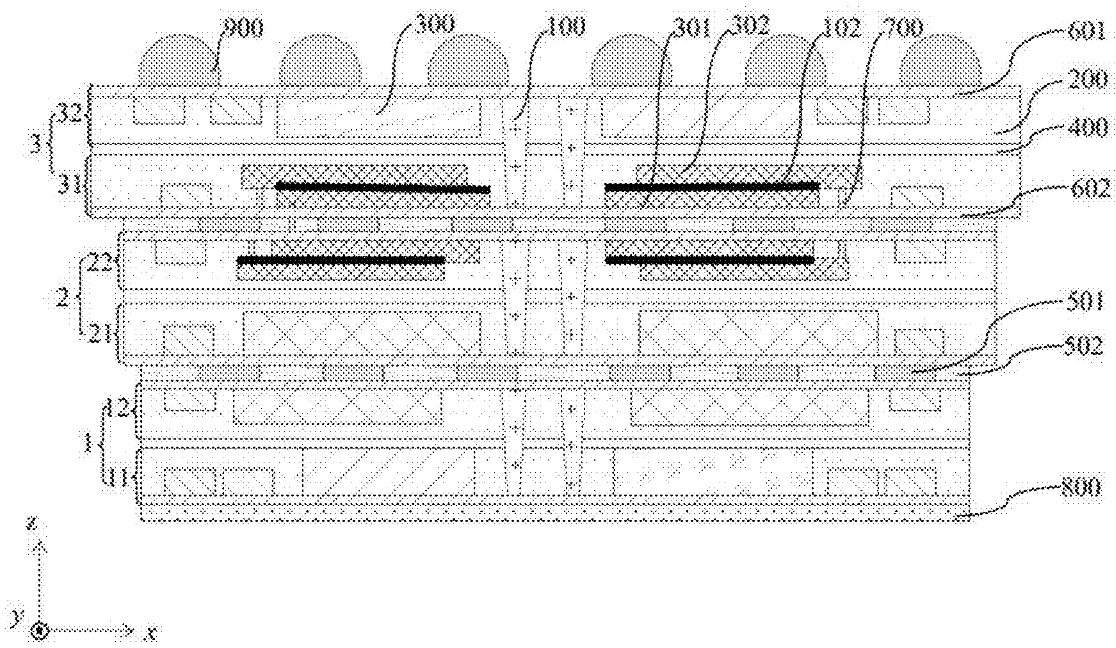
FIG. 1 is a diagram of a cross-sectional structure of a semiconductor package structure in accordance with some implementations of the present disclosure.

For better understanding of the disclosure, various aspects of the present disclosure will be described with reference to accompanying drawings. These descriptions are only for the purpose of explaining implementations of the present disclosure and will in no way limit the scope of the present disclosure. Throughout the specification, identical reference numerals refer to identical elements. The expression "and/or" includes any and all combinations of one or more of the associated listed items.

It is to be noted that, throughout this specification, expressions such as "first," "second," "third," and the like are only used to distinguish one feature from another, and mean no limitation for any feature especially in any order. Therefore, a "first surface" discussed in the present disclosure may also be referred to as a "second surface" and vice versa, without departing from teachings of the present disclosure.

In the figures, thicknesses, dimensions, and shapes of components have been adjusted for easy illustration. The figures are only examples and not strictly drawn to scale. As used herein, terms "approximate," "about," and the like indicate approximation instead of degrees and are intended to mean inherent variations in measurement values or calculated values, which can be appreciated by those of ordinary skills in the art.

It is also to be appreciated that, as used herein, expressions such as "include," "comprise," "have," and/or "contain" are open rather than closed expressions in this specification, which indicate existence of the stated feature, element, and/or component, but will not exclude existence of one or more other features, elements, components, and/or any combinations thereof. Furthermore, when the expression such as "at least one of" precedes a list of the listed features, it modifies all the listed features instead of any individual ones of the list. Furthermore, when describing implementations of the present disclosure, the term "may" is used to indicate "one or more implementations of the present disclosure." Also, the term "exemplary" is intended to refer to an example or illustration.

All the terms (including engineering terms and scientific and technical terms) used herein have the same meanings as those commonly understood by those of ordinary skills in the art, unless otherwise specified. The terms defined in common dictionaries should be interpreted to have meanings consistent with their contexts in pertinent arts and should not be interpreted too ideally or formally, unless otherwise specified explicitly in the disclosure.

It is to be noted that implementations and features in the present disclosure may be combined where there is no conflict. Furthermore, specific operations contained in a method described in the disclosure may not necessarily be performed in the described order and instead may be performed in any order or in parallel, unless there is an explicit definition or any conflict with the context. The disclosure will be described in detail hereafter in connection with implementations with reference to accompanying drawings.

Moreover, as used in the disclosure, the term "connect" or "couple" may indicate direct or indirect contact between respective components, unless it is otherwise defined explicitly or can be derived from the context.

FIG. 1 is a diagram of a cross-sectional structure of a semiconductor package structure 1000 in accordance with some implementations of the present disclosure.

As shown in FIG. 1, the semiconductor package structure 1000 provided by the present disclosure may include a plurality of package bodies, such as a first package body 1, a second package body 2 and a third package body 3, stacked in a first direction (the z direction). At least one of the plurality of package bodies may include first interconnect structures 100 extending in the z direction and a plurality of sub package bodies stacked in the z direction. For example, the first package body 1 may include the first interconnect structures 100 extending in the z direction and a first sub package body 11 and a second sub package body 12 stacked in the z direction; the second package body 2 may include the first interconnect structures 100 extending in the z direction and a third sub package body 21 and a fourth sub package body 22 stacked in the z direction; and the third package body 3 may include the first interconnect structures 100 extending in the z direction and a fifth sub package body 31 and a sixth sub package body 32 stacked in the z direction. Each of the plurality of sub package bodies may include a molding body 200 and a device structure 300 encapsulated in the molding body 200. The device structure 300 may include at least one of a passive device and an active device with the passive device. The passive device may include at least one of a resistor, a capacitor, or an inductor. The active device may include at least one of an electronic tube, a transistor, or a memory chip.

FIG. 1 shows that the semiconductor package structure includes three package bodies, and each package body includes two sub package bodies. However, the number of the package bodies and the number of the sub package bodies shown in the figures and related description are only provided for ease of illustration, and has no limitation on the present disclosure. In practical applications, one semiconductor package structure may include a plurality of package bodies, and each package body may include a plurality of above-mentioned sub package bodies or may include no sub package body.

The semiconductor package structure described above may have a plurality of device structures of different types encapsulated in the sub package bodies, and a plurality of package bodies in a high stack may be electrically interconnected through interconnect structures such as the first interconnect structures extending in the direction in which the sub package bodies are stacked, thereby improving the density of the overall circuit layout and compatibility of the package structure, while reducing the complexity of the packaging process and satisfying the requirements of electronic products for lightweight, compact designs.

In some implementations, the memory chip may include at least one of a nonvolatile memory chip and a volatile memory chip. The nonvolatile memory chip may include at least one of a 3D NAND memory chip, a 3D NOR memory chip, a ferroelectric memory chip, and a phase change memory chip.

Figure 2:
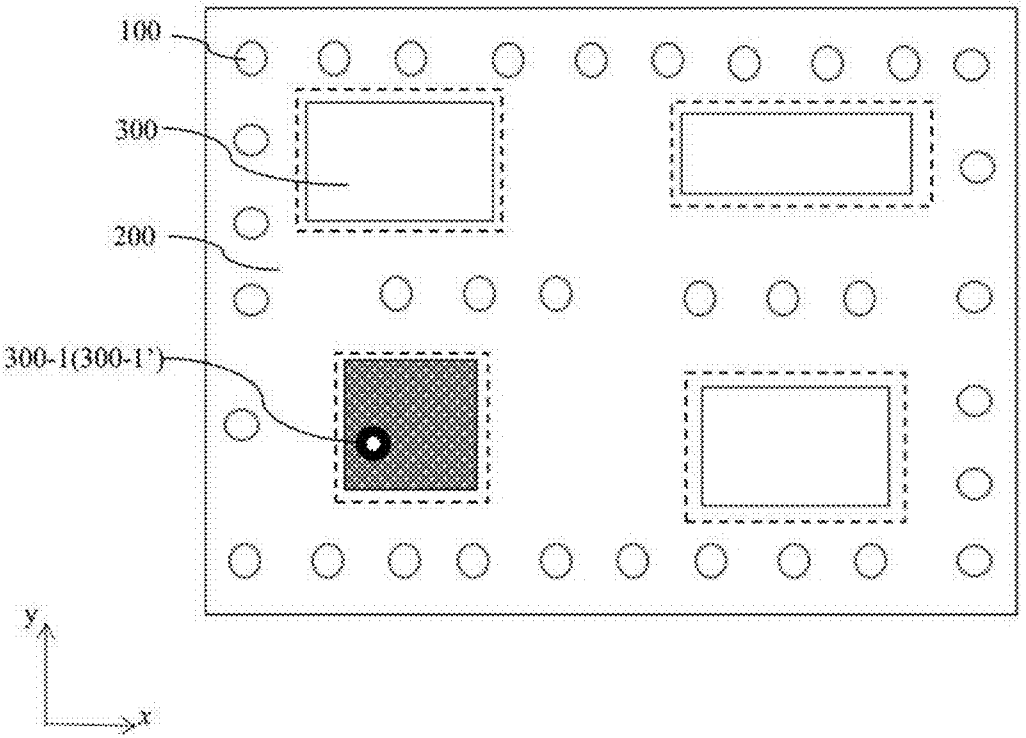
FIG. 2 is a top view of a sub package body in accordance with some implementations of the present disclosure.

FIG. 2 is a top view of a sub package body 11 in accordance with some implementations of the present disclosure.

As shown in FIG. 2, at least one of the plurality of sub package bodies, for example, the first sub package body 11, may further include an interposer 300-1 that includes a high-speed interposer interface 300-1' exposed from the molding body 200 to connect with external circuits. In some implementations, the interposer 300-1 may be a silicon interposer. For example, the interposer 300-1 may usually include a plurality of metal layers, each of which may include a plurality of line tracks with each line track including a plurality of metal lines. The device structures 300 may be connected with each other through the above-mentioned line tracks and connected with external circuits through the above-mentioned line tracks and the high-speed interface 300-1'. In some implementations, the interposer 300-1 may further include through silicon vias (TSVs) therein as well as metal bumps or solder balls on its surface. In the present disclosure, the structure and position of the interposer are not limited, and its material, structure, and shape, as well as the way in which it is connected with other components, may be varied to obtain various results and advantages.

Figure 3:
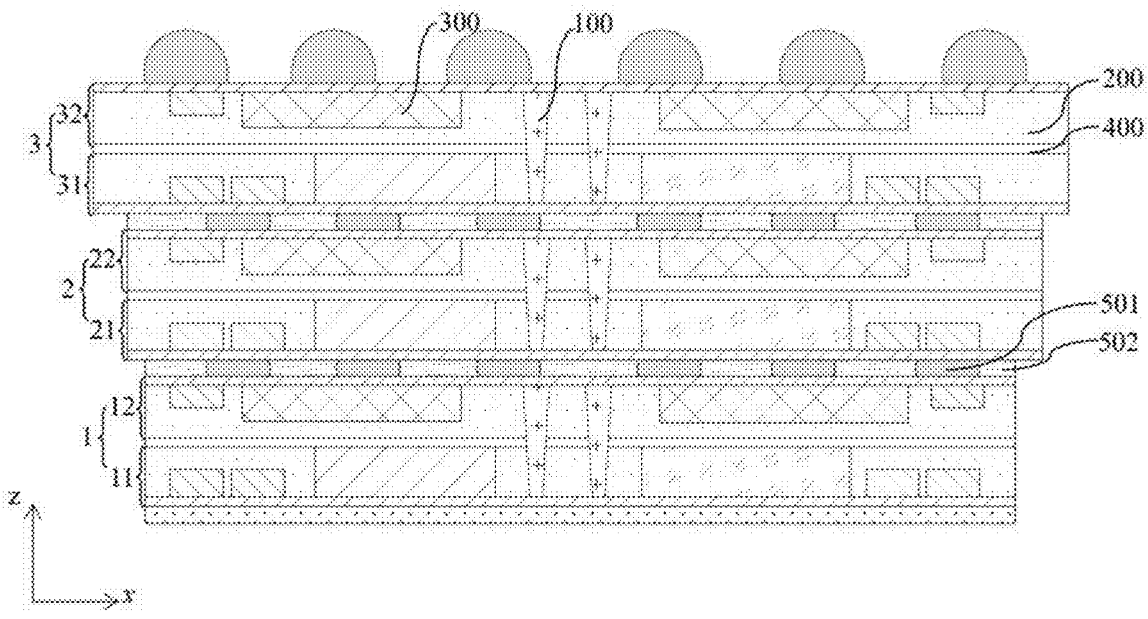
FIGS. 3 to 9 are diagrams of cross-sectional structures of a semiconductor package structure in accordance with some implementations of the present disclosure.

FIG. 3 is a diagram of a cross-sectional structure of a semiconductor package structure 1000 in accordance with some implementations of the present disclosure.

In connection with FIGS. 1 to 3, in some implementations, the first interconnect structures 100 may include through molding vias (TMVs). As shown in FIG. 2, the first sub package body 11 may include a first region (delineated by the dashed boxes) having the device structures 300 located therein and a second region (outside the dashed boxes), different from the first region, having no device structure 300 disposed therein. The first interconnect structures 100 may be formed in the second region of the molding body 200. In the present disclosure, the structure and position of the first interconnect structures are not limited, and the material, structure, and shape of the first interconnect structures, as well as the way in which they are connected with other components, may be varied to obtain various results and advantages.

The first interconnect structures 100 may include elongated holes (not shown) extending in the z direction (the thickness direction of the molding body 200) and metal filling pillars (not shown) filled in the elongated holes. In some implementations, the metal filling pillars may be copper pillars with good performance in conductivity and heat dissipation. The molding material used to form the molding body 200 may include any one of polyimide, silica, and epoxy molding compound (EMC).

In some implementations, the first sub package body 11 and the second sub package body 12 adjacent to each other in the z direction may be connected through direct bonding. In contrast to using other ways of connecting, adjacent sub package bodies connected using the direct bonding may have a lower degree of deformation, a smaller connection spacing, and less residual stress.

In some implementations, the first sub package body 11 and the second sub package body 12 adjacent to each other may be connected via a connecting layer 400 disposed therebetween. The connecting layer 400 may be a complex layer structure or a single layer structure. The connecting layer 400 may include a bonding layer (not shown) including, but not limited to, a glass glaze bonding layer, an adhesive bonding layer, or a solder bonding layer. As shown in FIG. 1, the connecting layer 400 extends in a plane (an x-y plane) perpendicular to the z direction and is connected with the first interconnect structures 100. The first interconnect structures 100 may have a relatively high content of metal, and using the connecting layer 400 and the first interconnect structures 100 connected therewith, the heat generated by the device structures 300 may be radiated outside rapidly to improve the heat dissipation of the whole package structure, thereby achieving high-density integration of semiconductor devices into the package structure.

In addition, to enhance the effect described above, the connecting layer 400 may include a good conductor, and the device structure 300 may include a surface (not shown) exposed from the molding body 200. The exposed surface of the device structure 300 may contact the connecting layer 400 to speed heat dissipation and enlarge the heat dissipation area of the device structure.

In addition, with reference to FIGS. 1 and 3, in some implementations, a plurality of package bodies included in the semiconductor package structure 1000 may be the same as each other or different from each other. For example, as shown in FIG. 1, the first package body 1, the second package body 2, and the third package body 3 have their structures different from each other and, as shown in FIG. 3, the first package body 1, the second package body 2, and the third package body 3 have the same structure.

Figure 4:
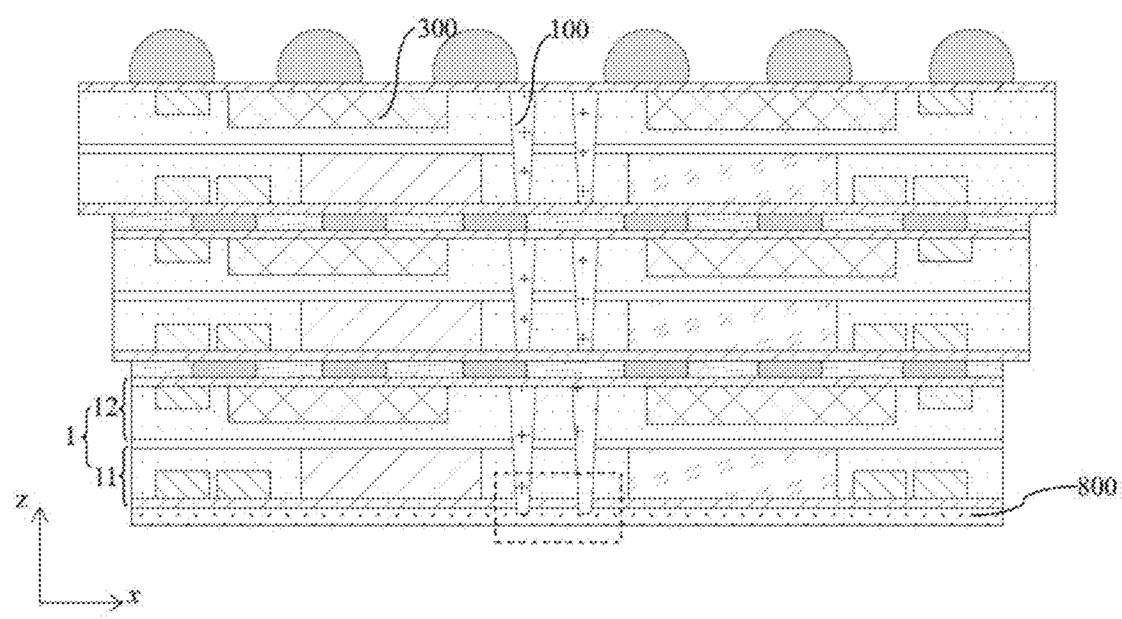

FIG. 4 is a diagram of a cross-sectional structure of a semiconductor package structure 1000 in accordance with some implementations of the present disclosure.

With reference to FIGS. 1 and 4, to enhance the effect described above, in some implementations, the package structure 1000 may further include a front side and a back side opposite to each other in the z direction, and a second insulating dielectric layer 800 is disposed on the back side. The second insulating dielectric layer 800 may be a complex layer structure or a single layer structure and includes a good thermal conductor. The first package body 1 is the closest one to the second insulating dielectric layer 800 in the z direction, and the first interconnect structures 100 of the first package body 1 extend in the z direction to the second insulating dielectric layer 800, as shown in the dashed box in FIG. 4. The first interconnect structures have a relatively high content of metal and extend into the second insulating dielectric layer including a good thermal conductor, thereby facilitating the heat dissipation of the device structures and enlarging the heat dissipation area of the device structures.

Figure 5:
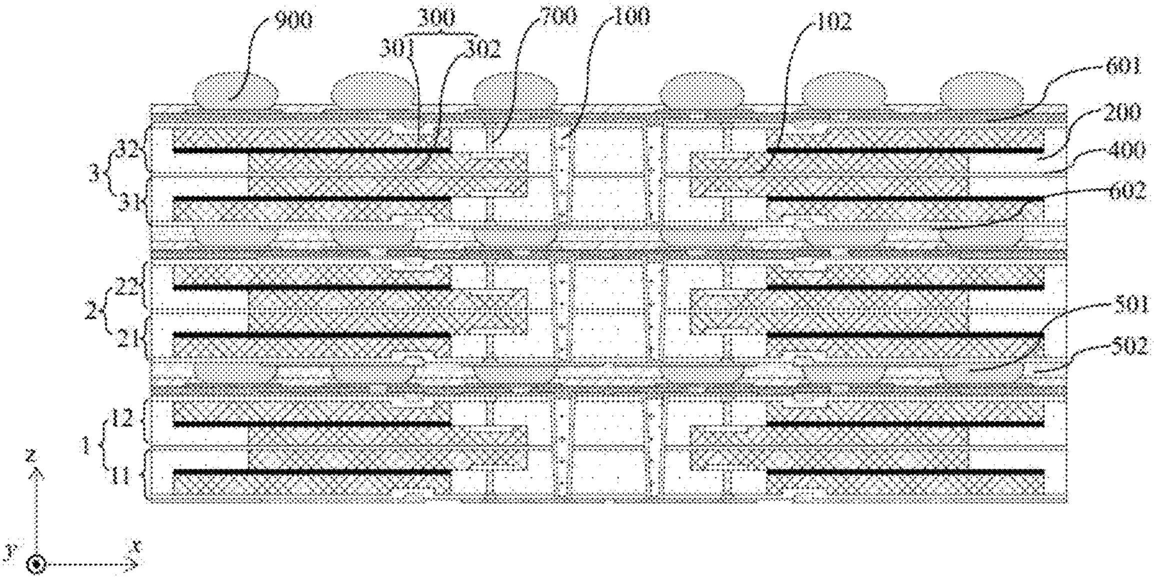

FIG. 5 is a diagram of a cross-sectional structure of a semiconductor package structure 1000 in accordance with some implementations of the present disclosure.

With reference to FIGS. 1 and 5, in some implementations, the device structure 300 may include a plurality of chips including a plurality of 3D NAND memory chips. The plurality of chips may include at least one first chip 301 and the rest chips 302 with the first chip 301 being any one of the plurality of chips. In FIGS. 1 and 4, the plurality of chips are exemplary shown as two chips. However, the number of chips shown in the figures and related description herein are only provided for ease of illustration and has no limitation on the present disclosure. In practical applications, one device structure may include various numbers of chips.

In addition, at least one of the plurality of sub package bodies may further include a redistribution layer. For example, the sixth sub package body 32 includes a first redistribution layer 601 on one side and the fifth sub package body 31 includes a second redistribution layer 602 on the other side. The redistribution layer may be a complex layer structure or a single layer structure.

The first chip 301 is disposed close to and electrically connected with the first redistribution layer 601 or the second redistribution layer 602. The rest chips 302 may be disposed sequentially on the side of first chip 301 away from the redistribution layer corresponding to the first chip 301 and are electrically connected with the redistribution layer through second interconnect structures 700 that are disposed between the rest chips 302 and the redistribution layer. In some implementations, the second interconnect structures 700 may include, but not limited to, any one of a vertical wiring structure and a through silicon via (TSV) structure.

In some implementations, a die attach film (DAF) 102 may be disposed between the chips adjacent to each other in the z direction. For example, the first chip 301 and the chip 302 adjacent to the first chip 301 in the z direction may be connected through the die attach film 102.

In some implementations, at least one of the plurality of package bodies includes first interconnect structures extending in the z direction and a plurality of sub package bodies stacked in the z direction. In addition, at least one of the plurality of package bodies further includes a first redistribution layer 601 and a second redistribution layer 602 disposed in the z direction. The device structure 300 included in at least one of the above-described plurality of package bodies is electrically connected with at least one of the first redistribution layer 601 and the second redistribution layer 602, and the first interconnect structures 100 extend in the z direction to the first redistribution layer 601 and the second redistribution layer 602. For example, when taken as an example, the third package body 3 includes first interconnect structures 100 extending in the z direction and includes the fifth sub package body 31 and the sixth sub package body 32 that are stacked in the z direction. In addition, the third package body 3 further includes a first redistribution layer 601 and a second redistribution layer 602 disposed in the z direction. The device structure 300 included in the third package body 3 is electrically connected with at least one of the first redistribution layer 601 and the second redistribution layer 602, and the first interconnect structures 100 extend in the z direction to the first redistribution layer 601 and the second redistribution layer 602.

Figure 6:
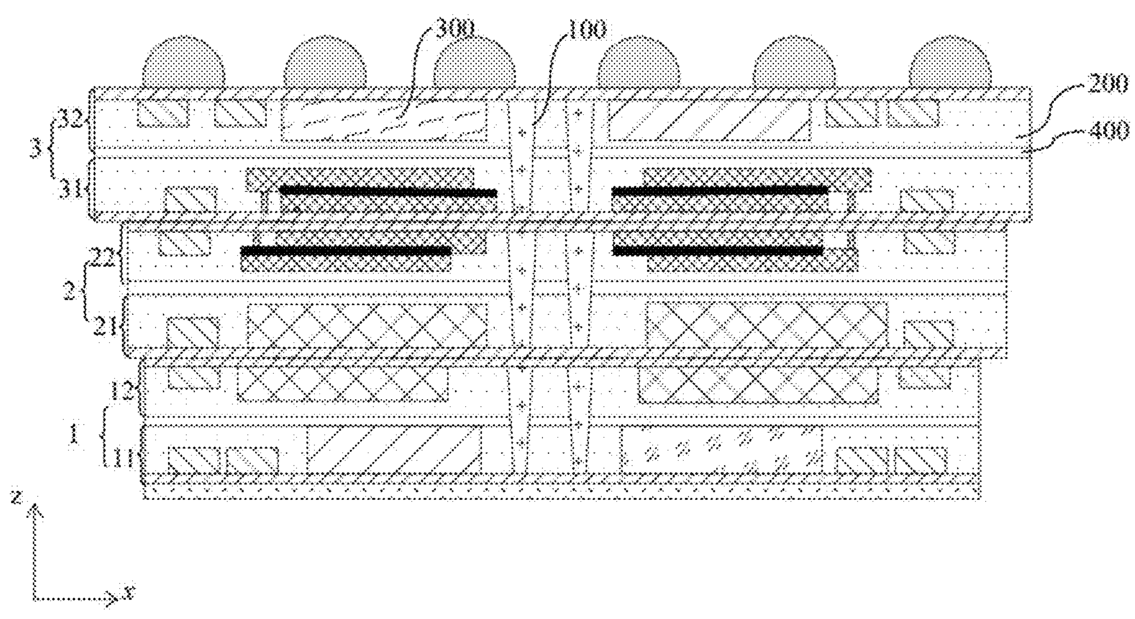

FIG. 6 is a diagram of a cross-sectional structure of a semiconductor package structure 1000 in accordance with some implementations of the present disclosure.

As shown in FIG. 6, in some implementations, adjacent package bodies may be connected through direct bonding. For example, the first package body 1 and the second package body 2 adjacent to each other in the z direction are connected through direct bonding, and the second package body 2 and the third package body 3 adjacent to each other in the z direction are connected through direct bonding. In contrast to using other ways of connecting, adjacent package bodies connected using direct bonding may have a lower degree of deformation, a smaller connection spacing, and less residual stress.

As shown in FIG. 1, in some implementations, first electrically connecting structures 501 are disposed between adjacent surfaces of adjacent package bodies, and the adjacent package bodies are connected through the first electrically connecting structures 501. For example, the first package body 1 and the second package body 2 adjacent to each other in the z direction may be connected through direct bonding. Or the first electrically connecting structures 501 may be disposed between the adjacent surfaces of the first package body 1 and the second package body 2 which are connected through the first electrically connecting structures 501.

In some implementations, the first electrically connecting structures 501 may include at least one of a solder ball, a metal bump, a bonding structure, or a conductive glue structure. A first insulating dielectric layer 502 may be disposed between the plurality of electrically connecting structures 501 in an x-y plane. For example, the first electrically connecting structures 501 may include package-on-package (POP) tin balls and the first insulating dielectric layer 502 may include a liquid molding layer such as an under fill layer, a non-conductive film (NFC), or the like.

Figure 7:
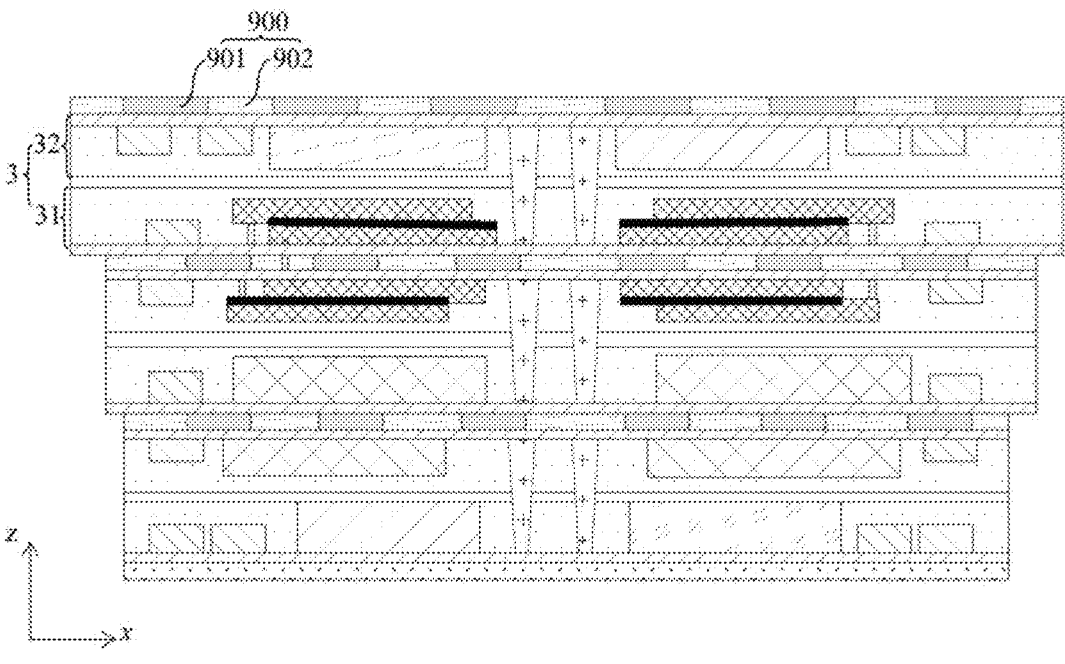

FIG. 7 is a diagram of a cross-sectional structure of a semiconductor package structure 1000 in accordance with some implementations of the present disclosure.

In connection with FIGS. 1 and 7, in some implementations, the package structure 1000 further includes second electrically connecting structures 900 configured to connect with external circuits. The second electrically connecting structure 900 may be disposed on the front side of the package structure 1000 and includes at least one of a solder ball, a metal bump, a bonding structure, or a conductive glue structure. For example, the second electrically connecting structure 900 may include tin balls. The second electrically connecting structure 900 may include POP tin balls 901 and a liquid molding layer 902 such as an under fill layer or an NCF.

The first interconnect structures and the second interconnect structures are used in combination with the redistribution layers to achieve electrical connectivity in both vertical and lateral directions for the package bodies. The first interconnect structures and the second interconnect structures are also used in combination with the redistribution layers, the first electrically connecting structures, and the second electrically connecting structures to achieve electrical connectivity in both vertical and lateral directions among different package bodies and electrical connectivity between the package bodies and the outside. Therefore, electrical interconnection among a plurality of package bodies in a high stack can be achieved through interconnect structures, for example, the first interconnect structures extending in the direction in which the sub package bodies are stacked. In addition, the overall circuit layout density, high-frequency performance, and compatibility of the packaging structure can be enhanced by various components set on both sides of the package, such as the first redistribution layer, the second redistribution layer, the first electrically connecting structures, the second electrically connecting structures and the like. Through the vertical interconnect structures such as the first interconnect structures and the second interconnect structures, the length for interconnection may be shortened, the signal delay may be decreased, the capacitance and inductance effects may be reduced, enabling low-power and high-speed communication between the device structures. Therefore, through the above-described interconnect structures, the density of the overall circuit layout and compatibility of the package structure may be increased, the complexity of the packaging process may be lowered, thus satisfying the demand for lightweight and compact electronic products.

Figure 8:
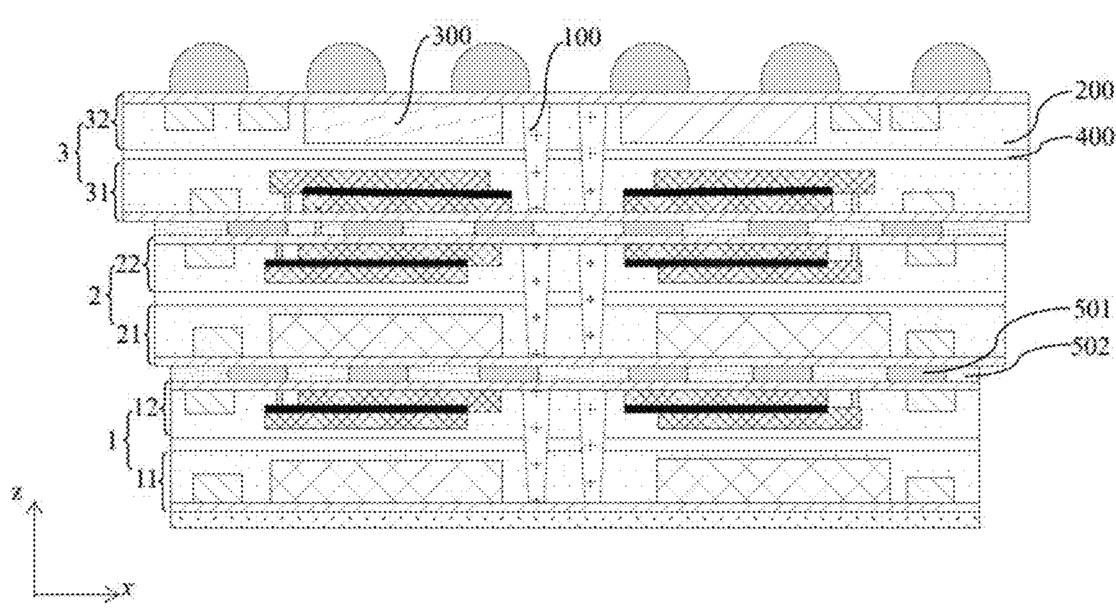
Figure 9:
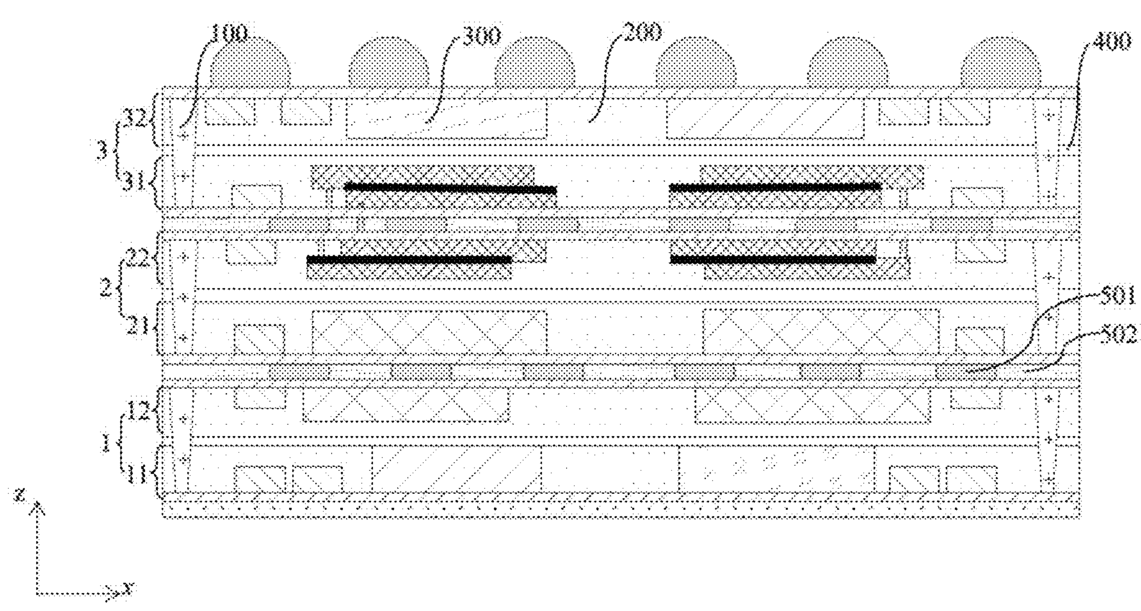

FIG. 8 is a diagram of a cross-sectional structure of a semiconductor package structure 1000 in accordance with some implementations of the present disclosure. FIG. 9 is a diagram of a cross-sectional structure of a semiconductor package structure 1000 in accordance with some implementations of the present disclosure.

With reference to FIGS. 1 to 9, in the semiconductor package structure provided in accordance with some implementations of the present disclosure, a plurality of device structures of different types may be flexibly packaged into sub package bodies to satisfy the need for system optimization. Using the modular semiconductor package structure, the difficulty of packaging processes may be lowered, and mass production may be realized. Meanwhile, the size of the package body can be designed flexibly in accordance with the combination of different device structures included in each of the package bodies, so that the mechanical performance of the whole semiconductor package structure can be improved. In some implementations, the device structures 300 included in the semiconductor package structure 1000 may include a power management unit, a control logic unit, a memory unit, and the like, and the above-mentioned chips may include at least one of a resistor, a capacitor, or an inductor, as well as include at least one of an electronic tube, a transistor, or a memory chip.

As shown in FIG. 5, the device structures 300 included in the semiconductor package structure 1000 may all be memory chips including at least one of a nonvolatile memory chip or a volatile memory chip. The nonvolatile chip may include at least one of a 3D NAND memory chip, a 3D NOR memory chip, a ferroelectric memory chip, or a phase change memory chip. Electrical connectivity in both vertical and lateral directions can be achieved through the first interconnect structures 100, the second interconnect structures 700, the first redistribution layer 601, and the second redistribution layer 602. In addition, in the whole semiconductor package structure 1000, the vertical and lateral interconnect structures presented above are used to achieve electrical connectivity in both vertical and lateral directions between different package bodies and electrical connectivity between the package structure and the outside.

Figure 10:
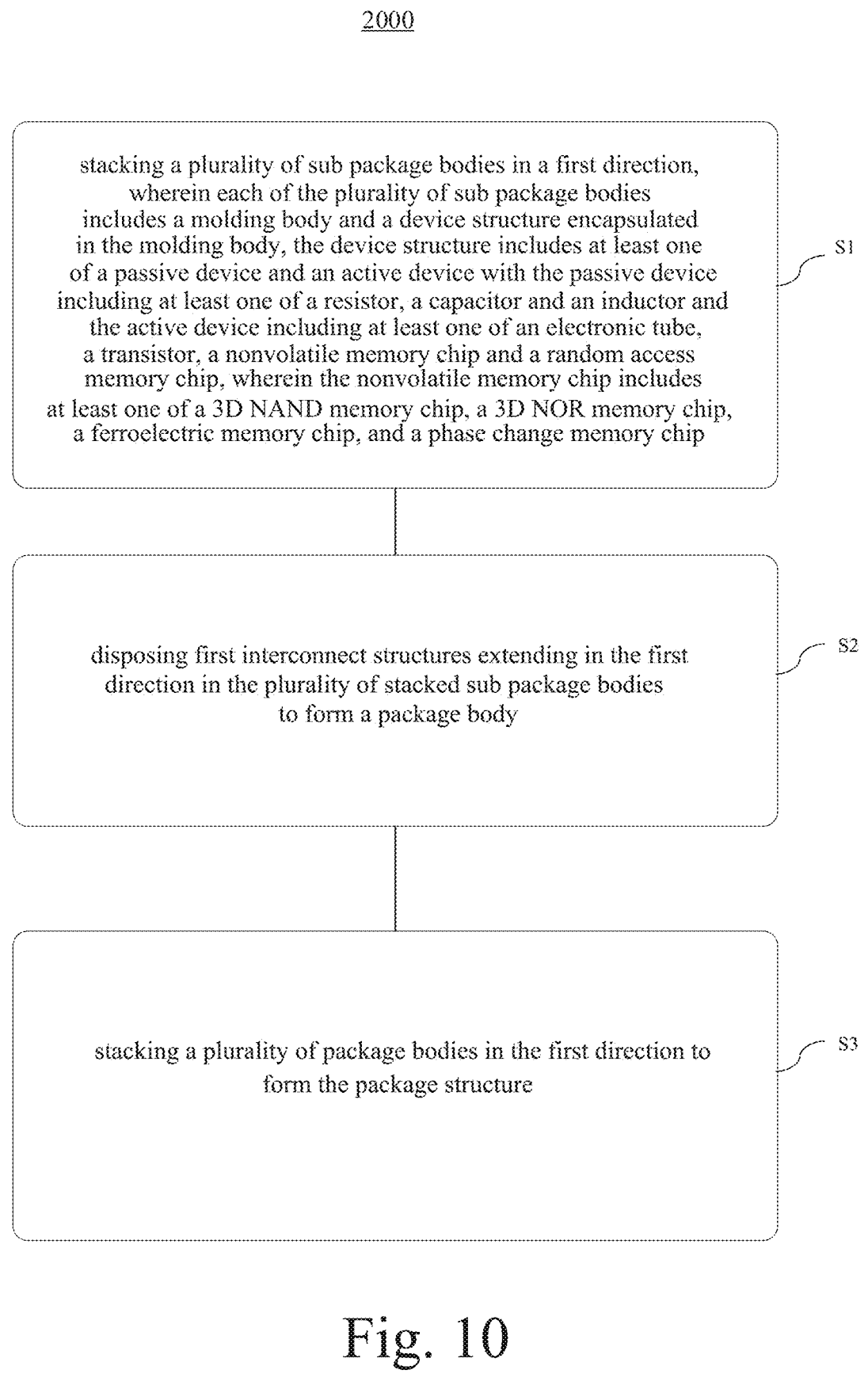

FIG. 10 is a flow chart illustrating a method 2000 of fabricating a semiconductor package structure in accordance with some implementations of the present disclosure.

As shown in FIG. 10, the method 2000 of fabricating a semiconductor package structure may include the following operations.

In operation S1, a plurality of sub package bodies are stacked in a first direction, and each of the plurality of sub package bodies includes a molding body and a device structure encapsulated in the molding body. The device structure includes at least one of a passive device or an active device with the passive device. The passive device may include at least one of a resistor, a capacitor, or an inductor. The active device may include at least one of an electronic tube, a transistor, or a memory chip.

In operation S2, first interconnect structures extending in the first direction are disposed in the plurality of stacked sub package bodies to form a package body.

In operation S3, a plurality of package bodies are stacked in the first direction to form the package structure.

Specific processes used in the various operations of the method 2000 of fabricating the above-described semiconductor package structure will be exemplified hereafter.

Operation S1

Figure 11:
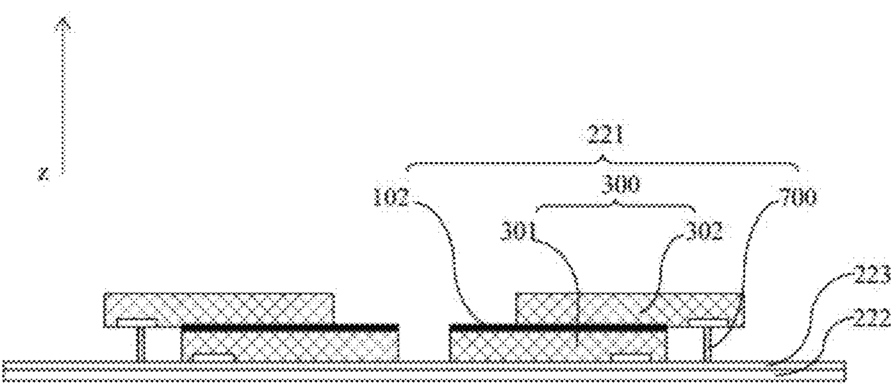
FIGS. 11 to 17 are schematic structure diagrams of a method of fabricating chips to be packaged within a semiconductor package structure in accordance with some implementations of the present disclosure.
Figure 12:
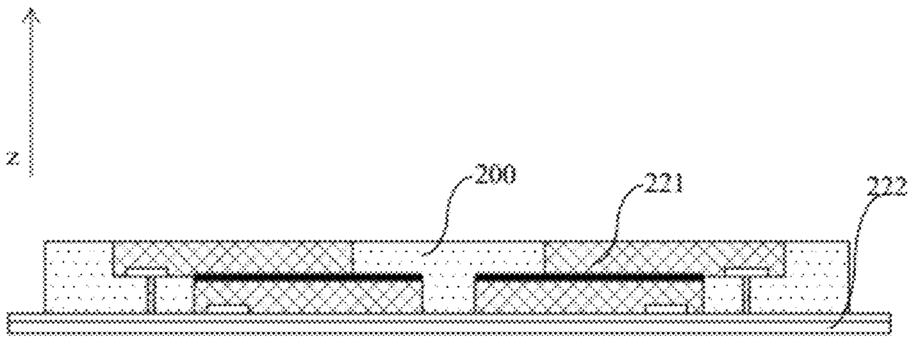
Figure 13:
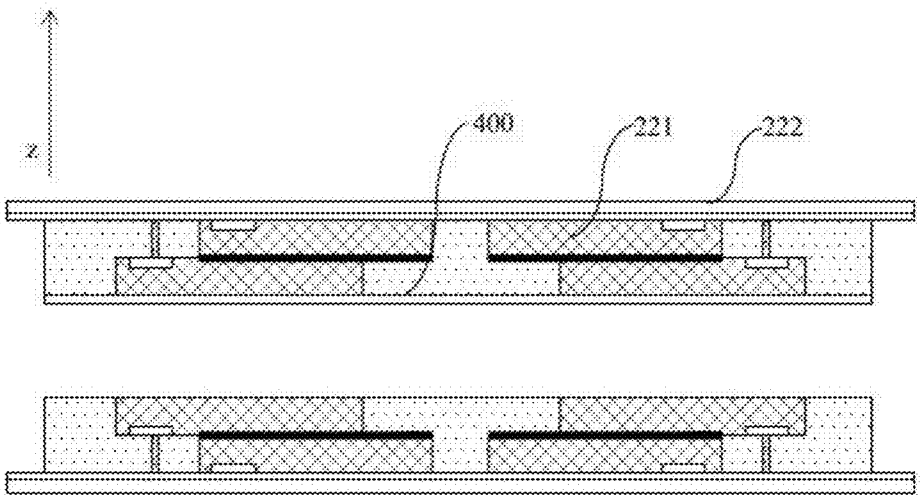
Figure 14:
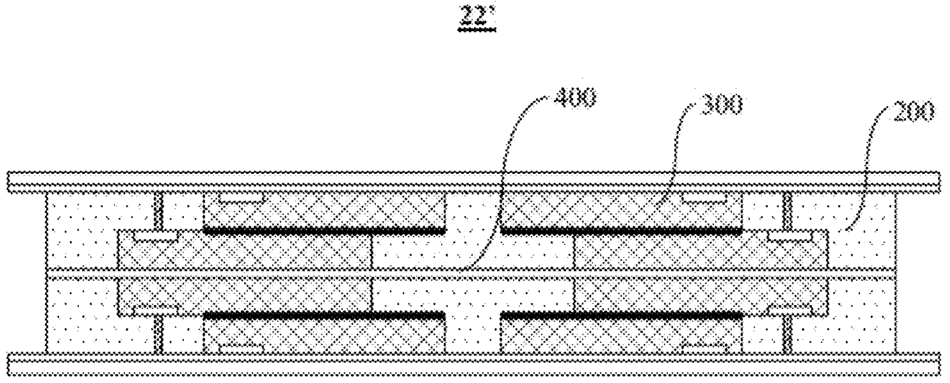

FIG. 11 is a cross-sectional diagram of a structure formed after forming and fixating an assembled device 221 in accordance with some implementations of the present disclosure. FIG. 12 is a cross-sectional diagram of a structure formed after encapsulating the portions of the assembled device 221 exposed after fixation by a molding body 200 in accordance with some implementations of the present disclosure. FIG. 13 is a cross-sectional diagram of a structure formed by connection of the molded assembled device 221 in accordance with some implementations of the present disclosure. FIG. 14 is a cross-sectional diagram of a structure formed after connection of the molded assembled device 221 in accordance with some implementations of the present disclosure.

In connection with FIG. 5 and FIGS. 11 to 14, in some implementations of the present disclosure, taking the formation of the first sub package body 11 or the fourth sub package body 22, in which the device structures 300 included in the first sub package body 11 and the fourth sub package body 22 are 3D NAND memory chips as an example, the operation S1 of stacking, in the first direction, a plurality of sub package bodies each including a molding body and device structures encapsulated in the molding body may include, for example, forming and fixating the assembled device 221, encapsulating the portions of the assembled device 221 exposed after fixation by the molding body 200, and connecting the molded assembled device 221.

In connection with FIGS. 5 and 11, in some implementations of the present disclosure, the device structure 300 may include a plurality of chips including at least one first chip 301 or the rest chips 302. The first chip 301 is any one of the plurality of chips. Second interconnect structures 700 are disposed on the rest chips 302 sequentially. The second interconnect structures 700 may include, but not limited to, vertical wiring structures and TSV structures that can be fabricated using conventional processes depending on practical demands and no further details will be repeated herein. The second interconnect structures can be disposed according to the requirements for the semiconductor package structure in practical applications. The structure, shape, material, and fabrication process of the second interconnect structures are not limited in the present disclosure.

After forming the second interconnect structures 700, the rest chips 302 provided with the second interconnect structures 700 are stacked sequentially, and the first chip 301 is disposed uppermost, to form the assembled device 221. In some implementations, the chips adjacent to each other in the z direction may be connected via a die attach film 102. For example, the rest chips 302 and the first chip 301 disposed thereon may be connected via the die attach film 102. After formation of the assembled device 221, a carrier 222 may be prepared, and a temporary attach layer 223 is disposed on the carrier 222. The assembled device 221 is turned upside down and fixed on the carrier 222 via the temporary attach layer 223. In connection with FIGS. 5 and 12, after fixation of the assembled device 221, the portions of assembled device 221 exposed after fixation may be encapsulated by the molding body 200. The molding material used to form the molding body 200 may include any one of polyimide, silica, or EMC.

In some implementations, sub package bodies adjacent to each other in the z direction may be connected through direct bonding. For example, the third sub package body 21 and the fourth sub package body 22 adjacent to each other in the z direction may be connected through direct bonding. Adjacent sub package bodies connected using direct bonding may have a lower degree of deformation, a smaller connection spacing, and less residual stress.

In connection with FIGS. 5, 13, and 14, a connecting layer 400 including a bonding layer may be disposed between the sub package bodies adjacent to each other in the z direction. An initial fourth sub package body 22' as shown in FIG. 14 can be formed by connecting the sub package bodies adjacent to each other in the z direction via the connecting layer 400. Subsequently, vertical and lateral interconnect structures may be formed in the initial fourth sub package body 22'.

The connecting layer 400 extends in a plane perpendicular to the z direction and is connected with the first interconnect structures to be formed subsequently. The connecting layer 400 may be a complex layer structure or a single layer structure. The connecting layer 400 may include a bonding layer including, but not limited to, a glass glaze bonding layer, an adhesive bonding layer, or a solder bonding layer. The first interconnect structures to be formed subsequently have a relatively high content of metal, and using the connecting layer 400 and the first interconnect structures connected therewith, the heat generated by the device structures 300 may be radiated outside rapidly to improve the heat dissipation of the whole package structure, thereby achieving high-density integration of semiconductor devices into the package structure. In some implementations, to enhance the effect described above, the connecting layer 400 may include a good conductor, and a portion of the surface of the device structure 300 may be exposed from the molding body 200 to contact the connecting layer 400.

Operation S2

Figure 15:
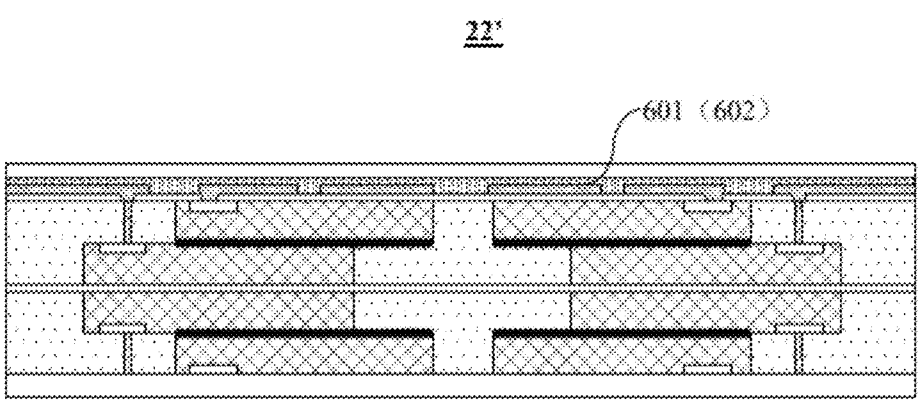
Figure 16:
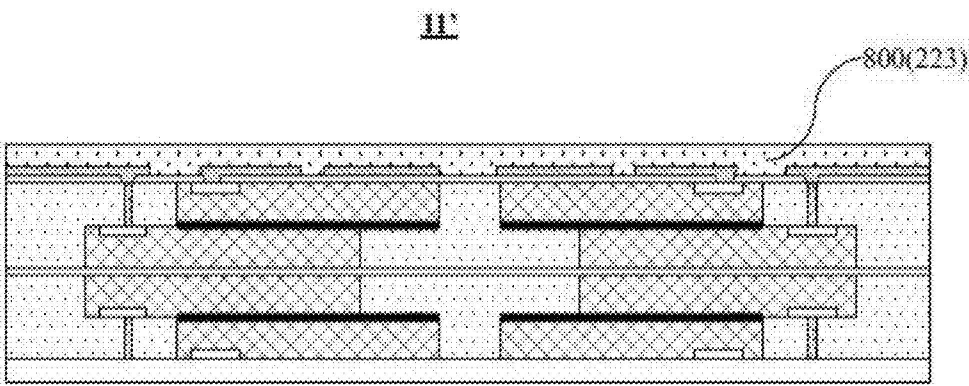

FIG. 15 is a cross-sectional diagram of a structure formed after forming a first redistribution layer 601 or a second redistribution layer 602 on the initial fourth sub package body 22' in accordance with some implementations of the present disclosure. FIG. 16 is a cross-sectional diagram of a structure formed after forming a second insulating dielectric layer on an initial sub package body 11' in accordance with some implementations of the present disclosure.

As shown in FIGS. 5 and 15, the operation S2 of disposing the first interconnect structures extending in the first direction in the plurality of stacked sub package bodies to form the package body may include: forming a redistribution layer on the initial sub package body and disposing the first interconnect structures in the initial sub package body.

In some implementations, forming the first redistribution layer 601 or the second redistribution layer 602 on the initial fourth sub package body 22' includes: forming a seed layer (not shown) on the outer surface of the initial fourth sub package body 22' using, for example, vacuum sputtering; forming an initial redistribution layer on the seed layer using, for example, pattern plating; and forming a solder mask on the initial redistribution layer and opening holes in the solder mask to expose the pad regions of the redistribution layer, so that the first redistribution layer 601 or the second redistribution layer 602 is formed.

In some implementations, the seed layer may include a layer of titanium on the outer surface of the initial fourth sub package body 22' and a layer of copper on the layer of titanium. The layer of titanium has a high adhesion force, good conductivity, and a consistent thickness, and the layer of copper can be attached firmly to the outer surface of the initial fourth sub package body 22' via the layer of titanium. In addition, the first redistribution layer 601 or the second redistribution layer 602 may include a sing layer structure, a two-layer structure, or a multi-layer structure with more than two layers. The material of the seed layer is not limited to the stack combination of two single metal material, but also may be a single metal material or an alloy material, as long as it can enable firm attachment of the redistribution layer and no further details will be repeated here.

As shown in FIGS. 4-5 and 16-17, the initial first sub package body 11' may be formed using the same above-described method as that for the initial fourth sub package body 22'. When the initial first sub package body 11' used to form the first sub package body 11 is taken as an example, in some implementations, the first sub package body 11 is positioned lowermost in the semiconductor package structure 1000, and one of its outer surfaces is the backside of the semiconductor package structure 1000. In some implementations, the carrier of the first sub package body (the initial first sub package body 11') prearranged lowermost is removed and a second insulating dielectric layer 800 is directly covered on a temporary attach layer 223 of the initial first sub package body 11'. The second insulating dielectric layer 800 may be a complex layer structure or a single layer structure and includes a good thermal conductor. The first interconnect structures 100 to be formed subsequently in the first package body 1 extend in the z direction to the second insulating dielectric layer 800, as shown in the dashed box in FIG. 4. The first interconnect structures have a relatively high content of metal and extend into the second insulating dielectric layer including a good thermal conductor, so that the speed of heat dissipation of the device structure can be increased, and the heat dissipation area of the device structure can be enlarged.

Figure 17:
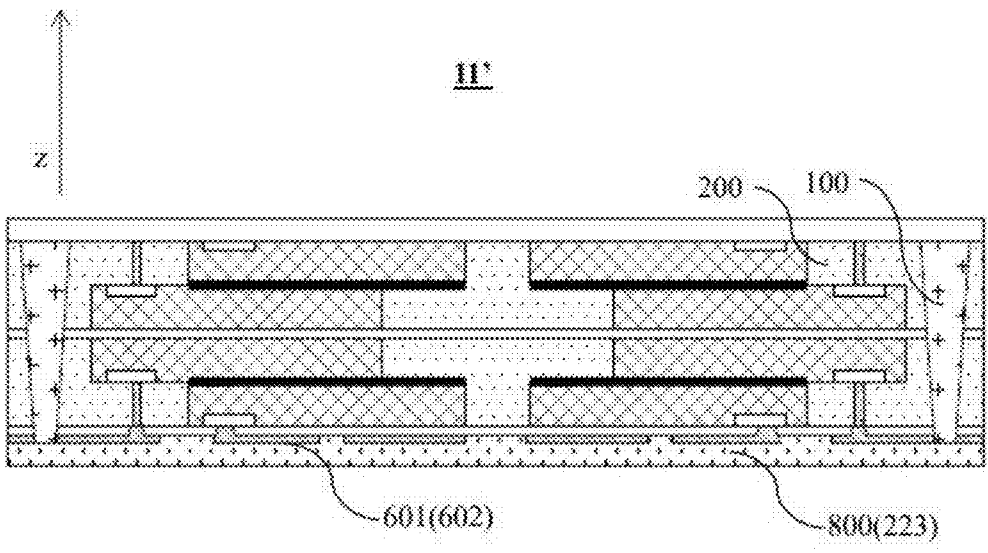

FIG. 17 is a cross-sectional diagram of a structure formed after forming the first interconnect structures 100 in the initial sub package body 11' in accordance with some implementations of the present disclosure.

As shown in FIGS. 5 and 15, in some implementations of the present disclosure, a redistribution layer may be formed on at least one surface of each sub package body in the package body structure 1000 using the above-mentioned method of forming the first redistribution layer 601 or the second redistribution layer 602 on the initial fourth sub package body 22'. In addition, the first interconnect structures 100 are further formed to be electrically connected with the redistribution layer. The first interconnect structures 100 extend in the z direction to the first redistribution layer 601 and the second redistribution layer 602.

In addition, in connection with FIGS. 2, 5 and 17, in some implementations of the present disclosure, taking the formation of the first sub package body 11 as an example, forming the first interconnect structures 100 may include: opening elongated holes (not shown) extending in the z direction in the initial first sub package body 11'; and forming metal filling pillars (not shown) in the elongated holes. The first sub package body 11 may include a first region (delineated by the dashed boxes) having device structures 300 located therein and a second region (outside the dashed boxes). Different from the first region, no device structure 300 is disposed in the second region. The first interconnect structures 100 may be formed in the second region of the molding body 200. After formation of the metal filling pillars, the surface of the initial first sub package body 11' may be processed through polishing or grinding to make the end of the metal filling pillar near the outer surface flush with the surface of the molding body 200. Through the processing for the above-described flushing, first interconnect structures of high quality and reliability can be obtained. In addition, the metal filling pillars may be made of copper having good conductivity.

In some implementations, the elongated holes may be formed using mechanical drilling or laser drilling. The shape of the cross section of the elongated hole is not limited and may have the shape of taper, cylinder, or cuboid. For example, when the elongated hole has the shape of taper, its specific ratio of depth to diameter may be designed and processed according to the ratio of thickness to diameter of the first interconnect structure 100. In addition, after opening of the elongated holes is completed, the elongated holes may be cleaned using, for example, plasma or solution to remove any residue. In some implementations, the elongated holes may be filled using a method such as physical vapor deposition, plating filling, chemical filling, or mechanical filling to form the metal filling pillars. Specific parameter characteristics of the first interconnect structures, such as materials, shapes, sizes, or fabrication processes, may be chosen according to practical demands or the specific design of the semiconductor package structure.

Operation S3

Referring to the FIGS. 5 and 17 again, in some implementations of the present disclosure, the operation S3 of stacking the plurality of package bodies in the first direction to form the package structure may include, for example, connecting the package bodies adjacent to each other in the z direction through direct bonding. For example, the first package body 1 and the second package body 2 adjacent to each other in the z direction are connected through direct bonding, and the second package body 2 and the third package body 3 adjacent to each other in the z direction are bonded connected through direct bonding. In contrast to using other ways of connecting, adjacent package bodies connected using direct bonding may have a lower degree of deformation, a smaller connection spacing, and less residual stress.

In some implementations, the operation S3 of stacking the plurality of package bodies in the first direction to form the package structure may include, for example, forming first electrically connecting structures 501 between adjacent surfaces of adjacent package bodies, where a first insulating dielectric layer 502 is filled between the plurality of first electrically connecting structures 501 in a plane perpendicular to the z direction, and the first electrically connecting structures 501 include at least one of a solder ball, a metal bump, a bonding structure, or a conductive glue structure.

For example, taking the first package body 1 and the second package body 2 as an example, the first package body 1 and the second package body 2 are adjacent to each other in the z direction, the first electrically connecting structures 501 may be disposed between adjacent surfaces of the first package body 1 and the second package body 2, which are connected through the first electrically connecting structures 501.

In some implementations, the first electrically connecting structures 501 may include at least one of a solder ball, a metal bump, a bonding structure, or a conductive glue structure. A first insulating dielectric layer 502 may be disposed between the plurality of first electrically connecting structures 501 in an x-y plane. For example, the first electrically connecting structures 501 may include package-on-package (POP) tin balls and the first insulating dielectric layer 502 may include a liquid molding layer such as an under fill layer, a non-conductive film (NFC), or the like. The first electrically connecting structures may be formed using conventional processes and fabricated according to practical demands, and no further details will be repeated here. The first electrically connecting structures may be disposed according to the requirements for the semiconductor package structure in practical applications. The structure, shape, material, and fabrication process of the first electrically connecting structures are not limited in the present disclosure.

Furthermore, in connection with FIGS. 5, 7 and 17, the method 2000 of fabricating a semiconductor package structure provided by the present disclosure may further include forming second electrically connecting structures 900 on the surface of the package body disposed uppermost in the package structure 1000. The second electrically connecting structures 900 may be disposed on the front side of the package structure 1000 and may include at least one of a solder ball, a metal bump, a bonding structure, or a conductive glue structure. For example, the second electrically connecting structures 900 may include tin balls. The second electrically connecting structures 900 may include POP tin balls 901 and a liquid molding layer 902, such as an under fill layer or an NCF. The first electrically connecting structures 501 and the second electrically connecting structures 900 may be formed using the same fabrication processes.

Using the method of fabricating a semiconductor package structure provided in accordance with implementations of the present disclosure, a plurality of device structures of different types can be encapsulated in the sub package bodies, and a plurality of package bodies in a high stack may be electrically interconnected through interconnect structures such as the first interconnect structures extending in the direction in which the sub package bodies are stacked, thereby increasing the density of the overall circuit layout and compatibility of the package structure, reducing the complexity of the packaging process, and satisfying the demand for lightweight and compact electronic products.

Figure 18:
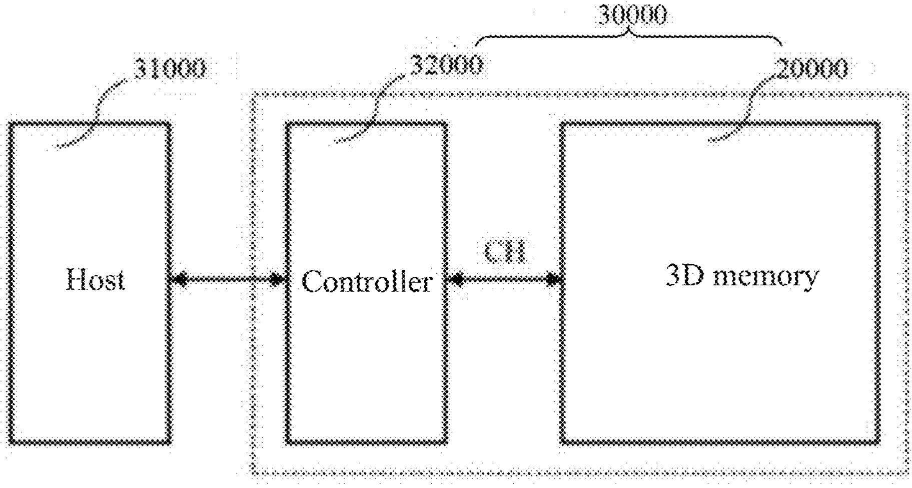
FIG. 18 is a structural diagram of a memory system in accordance with some implementations of the present disclosure.

FIG. 18 is a structural diagram of a memory system in accordance with some implementations of the present disclosure.

As shown in FIG. 18, a memory system 30000 is provided. The memory system 30000 may include a memory 20000 and a controller 32000 coupled to the memory 20000 to control data storage of the memory 20000. At least one of the controller 32000 or the memory 20000 is in the above-described semiconductor package structure 1000. The semiconductor package structure illustrated above may be used to form various memory systems. In some implementations, the memory system may be implemented as, for example, a UFS device, an SSD, a multimedia card in the form of MMC, eMMC, RS-MMS, or MMCmicro, a secure digital card in the form of SD, miniSD, and microSD, a memory device of the PCMCIA type, a memory device of the PCI type, a memory device of the PCI-E type, a CF card, a smart media card, or a memory stick, etc. The memory system is provided with the semiconductor package structure provided by the present disclosure, and thus has the same effects as the semiconductor package structure, and no further details will be repeated here.

In some implementations, the memory system 30000 may include a memory 20000 and a controller 32000. The memory system 30000 may include a memory 20000 and a controller 32000. At least one of the memory 20000 or the controller 32000 is in the above-described semiconductor package structure 1000. The controller 32000 can control the memory 20000 through a channel CH, and the memory 20000 can operate under the control of the controller 32000 in response to requests from the host 31000. The memory 20000 can receive commands (CMD) and addresses ADDR through the channel CH from the controller 32000 and access the regions in the memory cell array selected in response to the addresses. In other words, the memory 20000 may execute internal operations corresponding to the commands on the regions selected based on the addresses.

In some implementations, the memory 20000 may be a memory array wafer, or may be a memory including peripheral circuits. The memory 20000 may include at least one of a 2D memory or a 3D memory. The 3D memory may include at least one of a 3D NAND memory or a 3D NOR memory.

The description above is only for the purpose of explaining implementations and technical principles of the present disclosure. It will be appreciated by those skilled in the art that the scope claimed by the present disclosure is not limited to technical solutions composed of particular combinations of the above-mentioned technical features, and instead will cover other technical solutions composed of any combinations of the above-mentioned features and their equivalents without departing from the technical concept, for example, technical solutions resulted from substitutions of the above-mentioned features by technical features of similar functions (including, but not limited to) disclosed in the present disclosure.

The invention claimed is:

1. A semiconductor package structure, comprising:

a plurality of package bodies stacked in a first direction, at least one of the plurality of package bodies comprising:
- first interconnect structures extending in the first direction, and
- a plurality of sub package bodies stacked in the first direction, each of the plurality of sub package bodies comprising a molding body and a device structure encapsulated in and surrounded by the molding body, wherein:
- the device structure comprises a passive device comprising at least one of a resistor, a capacitor, or an inductor;
- a connecting layer is disposed between adjacent sub package bodies; and
- one of the first interconnect structures extends, in the first direction, through the molding body of a respective sub package body and the connecting layer, and terminates at a redistribution layer.

2. The semiconductor package structure of claim 1, wherein:

the device structure comprises an active device with the passive device, wherein the active device comprises at least one of an electronic tube, a transistor, or a memory chip; and the adjacent sub package bodies are connected through direct bonding.

3. The semiconductor package structure of claim 2, wherein:

the memory chip comprises at least one of a nonvolatile memory chip or a volatile memory chip, the nonvolatile memory chip comprising at least one of a 3D NAND memory chip, a 3D NOR memory chip, a ferroelectric memory chip, or a phase change memory chip.

4. The semiconductor package structure of claim 1, wherein:

a connecting layer extends in a plane perpendicular to the first direction, is connected with the first interconnect structures, and comprises a bonding layer;

the connecting layer comprises a thermal conductor; and the device structure comprises a surface, wherein the surface is exposed from the molding body, and the exposed surface of the device structure contacts the connecting layer.

5. The semiconductor package structure of claim 1, wherein:

first electrically connecting structures are disposed between adjacent surfaces of adjacent package bodies, the first electrically connecting structures comprising at least one of a solder ball, a metal bump, a bonding structure, or a conductive glue structure; and a first insulating dielectric layer is disposed between a plurality of the first electrically connecting structures in a plane perpendicular to the first direction.

6. The semiconductor package structure of claim 1, wherein:

at least one of the plurality of package bodies further comprises a first redistribution layer and a second redistribution layer disposed in the first direction; and the device structure included in the at least one of the plurality of package bodies is electrically connected with at least one of the first redistribution layer or the second redistribution layer.

7. The semiconductor package structure of claim 1, wherein;

the device structure comprises a plurality of chips comprising at least a first chip and rest chips, at least one of the plurality of sub package bodies further comprises the redistribution layer, and the first chip is disposed proximate to and electrically connected with the redistribution layer; and the rest chips are disposed sequentially on a side of the first chip away from the redistribution layer, second interconnect structures are disposed between each of the rest chips and the redistribution layer, the plurality of chips comprise a plurality of three-dimensional (3D) NAND memory chips, and the first chip is any one of the plurality of chips.

8. The semiconductor package structure of claim 7, wherein a die attach film is disposed between the chips adjacent to each other in the first direction.

9. The semiconductor package structure of claim 1, further comprising:

a front side and a back side opposite to each other in the first direction, and a second insulating dielectric layer is disposed on the back side, wherein the second insulating dielectric layer comprises a thermal conductor, and the first interconnect structures in a closest package body to the second insulating dielectric layer in the first direction extend in the first direction to the second insulating dielectric layer.

10. The semiconductor package structure of claim 9, further comprising second electrically connecting structures configured to connect with external circuits, wherein the second electrically connecting structures are disposed on the front side and comprise at least one of a solder ball, a metal bump, a bonding structure, or a conductive glue structure.

11. The semiconductor package structure of claim 1, wherein:

the at least one of the plurality of sub package bodies further comprises an interposer, the interposer comprising a high-speed interposer interface exposed from the molding body to connect with external circuits.

12. A memory system, comprising:

a controller; and a memory, wherein the controller is coupled to the memory to control data storage of the memory, and at least one of the controller and the memory is in a semiconductor package structure, the semiconductor package structure comprising:

a plurality of package bodies stacked in a first direction, at least one of the plurality of package bodies comprising:

first interconnect structures extending in the first direction; and a plurality of sub package bodies stacked in the first direction, each of the plurality of sub package bodies comprising a molding body and a device structure encapsulated in and surrounded by the molding body, wherein:

the device structure comprises a passive device comprising at least one of a resistor, a capacitor, or an inductor;

a connecting layer is disposed between adjacent sub package bodies; and one of the first interconnect structures extends, in the first direction, through the molding body of a respective sub package body and the connecting layer, and terminates at a redistribution layer.

13. A method of fabricating a semiconductor package structure, comprising:

stacking a plurality of sub package bodies in a first direction, wherein each of the plurality of sub package bodies comprises a molding body and a device structure encapsulated in and surrounded by the molding body;

disposing first interconnect structures extending in the first direction in the plurality of sub package bodies to form one of package bodies; and stacking a plurality of the package bodies in the first direction to form the semiconductor package structure, wherein;

the device structure comprises a passive device comprising at least one of a resistor, a capacitor, or an inductor;

a connecting layer is disposed between adjacent sub package bodies; and one of the first interconnect structures extends, in the first direction, through the molding body of a respective sub package body and the connecting layer, and terminates at a redistribution layer.

14. The method of claim 13, wherein stacking the plurality of sub package bodies in the first direction comprises:

connecting the sub package bodies adjacent to each other in the first direction through direct bonding.

15. The method of claim 13, wherein stacking the plurality of sub package bodies in the first direction comprises:

disposing the connecting layer comprising a bonding layer between the sub package bodies adjacent to each other in the first direction, wherein the connecting layer extends in a plane perpendicular to the first direction and is connected with the first interconnect structures.

16. The method of claim 15, wherein the connecting layer comprises a thermal conductor, and the method further comprises:

exposing a portion of a surface of the device structure from the molding body; and contacting the exposed portion of the surface of the device structure with the connecting layer.

17. The method of claim 13, wherein stacking the plurality of package bodies in the first direction comprises:

connecting package bodies adjacent to each other in the first direction through direct bonding.

18. The method of claim 13, wherein stacking the plurality of package bodies in the first direction comprises:

forming first electrically connecting structures between adjacent surfaces of adjacent package bodies, wherein:

a first insulating dielectric layer is filled between the first electrically connecting structures in a plane perpendicular to the first direction; and the first electrically connecting structures comprise at least one of a solder ball, a metal bump, a bonding structure, or a conductive glue structure.

19. The method of claim 13, wherein disposing the first interconnect structures extending in the first direction in the plurality of sub package bodies to form the package body comprises:

disposing a first redistribution layer and a second redistribution layer in the package body in the first direction, wherein the device structure included in the package body is electrically connected with at least one of the first redistribution layer or the second redistribution layer; and disposing the first interconnect structures to extend in the first direction to the first redistribution layer and the second redistribution layer.

20. The method of claim 13, wherein the device structure comprises a plurality of chips comprising at least a first chip and rest chips, the plurality of chips comprise a plurality of 3D NAND memory chips, the method further comprises:

forming the plurality of sub package bodies, wherein forming one of the plurality of sub package bodies comprises:

disposing second interconnect structures on the rest chips sequentially;

stacking the rest chips with the second interconnect structures disposed thereon sequentially and disposing the first chip uppermost to form an assembled device;

turning the assembled device upside down and fixing it on a carrier via a temporary attach layer; and encapsulating portions of the assembled device exposed after fixation by the molding body.

* * * * *